United States Patent
Bhusarapu et al.

(10) Patent No.: US 9,156,705 B2
(45) Date of Patent: Oct. 13, 2015

(54) PRODUCTION OF POLYCRYSTALLINE SILICON BY THE THERMAL DECOMPOSITION OF DICHLOROSILANE IN A FLUIDIZED BED REACTOR

(75) Inventors: Satish Bhusarapu, Houston, TX (US); Puneet Gupta, Houston, TX (US); Yue Huang, Midlothian, VA (US)

(73) Assignee: SunEdison, Inc., Maryland Heights, MO (US)

( * ) Notice: Subject to any disclaimer, the term of this patent is extended or adjusted under 35 U.S.C. 154(b) by 1055 days.

(21) Appl. No.: 12/977,712

(22) Filed: Dec. 23, 2010

(65) Prior Publication Data

US 2012/0164323 A1 Jun. 28, 2012

(51) Int. Cl.
*C01B 33/03* (2006.01)
*B01J 2/00* (2006.01)
*C23C 16/44* (2006.01)
*B01J 2/16* (2006.01)
*C23C 16/442* (2006.01)
*C23C 16/24* (2006.01)

(52) U.S. Cl.
CPC . *C01B 33/03* (2013.01); *B01J 2/00* (2013.01); *B01J 2/006* (2013.01); *B01J 2/16* (2013.01); *C23C 16/24* (2013.01); *C23C 16/44* (2013.01); *C23C 16/4401* (2013.01); *C23C 16/442* (2013.01)

(58) Field of Classification Search
CPC ........ C23C 16/24; C23C 16/44; C23C 16/442
See application file for complete search history.

(56) References Cited

U.S. PATENT DOCUMENTS

| | | | |
|---|---|---|---|
| 2,999,735 | A | 9/1961 | Reuschel |
| 3,097,069 | A | 7/1963 | Reuschel |
| 3,120,451 | A | 2/1964 | Schmidt et al. |
| 4,117,094 | A | 9/1978 | Blocher, Jr. et al. |
| 4,784,840 | A | 11/1988 | Gautreaux et al. |
| 4,868,013 | A | 9/1989 | Allen |
| 4,992,245 | A | 2/1991 | Van Slooten et al. |
| 5,189,500 | A | 2/1993 | Kusunoki |
| 5,436,175 | A | 7/1995 | Nakato et al. |
| 5,571,373 | A | 11/1996 | Krishna et al. |
| 5,810,934 | A * | 9/1998 | Lord et al. .............. 118/725 |
| 6,007,869 | A | 12/1999 | Schreieder et al. |
| 6,790,747 | B2 | 9/2004 | Henley et al. |
| 6,849,244 | B2 | 2/2005 | Konig et al. |
| 6,932,954 | B2 | 8/2005 | Wakamatsu et al. |

(Continued)

FOREIGN PATENT DOCUMENTS

| | | |
|---|---|---|
| GB | 1570131 | 4/1977 |
| JP | 59107917 A | 6/1984 |
| JP | 6127914 A | 5/1994 |

OTHER PUBLICATIONS

PCT Invitation to Pay Additional Fee of the International Searching Authority mailed on Dec. 18, 2012 regarding PCT/US2012/057508.

(Continued)

*Primary Examiner* — Erma Cameron
(74) *Attorney, Agent, or Firm* — Armstrong Teasdale LLP

(57) ABSTRACT

Processes for producing polycrystalline silicon by thermal decomposition of dichlorosilane are disclosed. The processes generally involve thermal decomposition of dichlorosilane in a fluidized bed reactor operated at reaction conditions that result in a high rate of productivity relative to conventional production processes.

45 Claims, 3 Drawing Sheets

(56) References Cited

U.S. PATENT DOCUMENTS

| | | | |
|---|---|---|---|
| 7,161,224 | B2 | 1/2007 | Tolchinsky et al. |
| 7,452,584 | B2 | 11/2008 | Maleville |
| 2002/0081250 | A1 | 6/2002 | Lord |
| 2002/0187595 | A1 | 12/2002 | Walitzki et al. |
| 2006/0024915 | A1 | 2/2006 | Kobayashi |
| 2007/0042566 | A1 | 2/2007 | Seacrist et al. |
| 2007/0231931 | A1 | 10/2007 | Ecarnot et al. |
| 2008/0056979 | A1 | 3/2008 | Arvidson et al. |
| 2008/0241046 | A1* | 10/2008 | Hertlein et al. ............... 423/349 |
| 2008/0267834 | A1 | 10/2008 | Kim et al. |
| 2008/0299291 | A1* | 12/2008 | Weidhaus et al. ............... 427/8 |
| 2009/0004090 | A1 | 1/2009 | Kim et al. |
| 2009/0047204 | A1* | 2/2009 | Kim et al. ............... 423/349 |
| 2009/0095710 | A1 | 4/2009 | Kim et al. |
| 2009/0130015 | A1* | 5/2009 | Saegusa et al. ............... 423/350 |
| 2009/0232722 | A1* | 9/2009 | Saegusa ............... 423/350 |
| 2009/0324479 | A1 | 12/2009 | Kulkarni et al. |
| 2009/0324819 | A1 | 12/2009 | Kulkarni et al. |
| 2010/0112744 | A1* | 5/2010 | Molnar ............... 438/57 |
| 2010/0266762 | A1* | 10/2010 | Fieselmann et al. ............... 427/212 |
| 2012/0100059 | A1 | 4/2012 | Bhusarapu et al. |
| 2012/0164323 | A1 | 6/2012 | Bhusarapu et al. |

OTHER PUBLICATIONS

PCT International Search Report and Written Opinion of the International Searching Authority mailed on Jun. 27, 2012 regarding PCT/US2011/064315; 15 pages.

Co-Owned U.S. Appl. No. 12/977,849, filed Dec. 23, 2010.

Co-Owned U.S. Appl. No. 12/977,739, filed Dec. 23, 2010.

A. Briglio, Jr., An Analysis of the Feasibility of Producing Silicon for Solar Cells by a Dichlorosilane/Fluidized-Bed Reactor Process, Technical Report, National Aeronautics and Space Administration, May 1984, 21 pages.

Dr. James R. McCormick, et al., Development of a Polysilicon Process Based on Chemical Vapor Deposition, Final Report, Hemlock Semiconductor Corporation, Aug. 1982, 149 pages.

Perry's Chemical Engineers' Handbook, 7th Ed., 17-4, Gas-Solid Operations and Equipment, 1 page, 1986.

* cited by examiner

PRODUCTION OF POLYCRYSTALLINE SILICON BY THE THERMAL DECOMPOSITION OF DICHLOROSILANE IN A FLUIDIZED BED REACTOR

BACKGROUND

The field of the present disclosure relates to processes for producing polycrystalline silicon by thermally decomposing dichlorosilane and, particularly, processes that involve thermal decomposition of dichlorosilane in a fluidized bed reactor operated at reaction conditions that result in a high rate of productivity relative to conventional production processes.

Polycrystalline silicon is a vital raw material used to produce many commercial products including, for example, integrated circuits and photovoltaic (i.e., solar) cells. Polycrystalline silicon is often produced by a chemical vapor deposition mechanism in which silicon is deposited from a thermally decomposable silicon compound onto silicon particles in a fluidized bed reactor. The seed particles continuously grow in size until they exit the reactor as polycrystalline silicon product (i.e., "granular" polycrystalline silicon). Suitable thermally decomposable silicon compounds include, for example, silane and halosilanes such as trichlorosilane.

In many fluidized bed reactor systems and especially in systems where material from the fluid phase chemically decomposes to form solid material such as in polycrystalline silicon production systems, solid material may deposit onto the walls of the reactor. The wall deposits often alter the reactor geometry which can decrease reactor performance. Further, portions of the wall deposits can dislodge from the reactor wall and fall to the reactor bottom. Often the reactor system must be shut down to remove the dislodged deposits. To prevent an untimely reactor shut down, the deposits must be periodically etched from the reactor wall and the reactor must be cleaned thereby reducing the productivity of the reactor. The etching operations may cause stress to the reactor system due to thermal shock or differences in thermal expansion or contraction which may result in cracking of the reactor walls which requires the unit to be rebuilt. These problems are particularly acute in fluidized bed reactor systems used in the production of polycrystalline silicon. Previous efforts to reduce deposition of solids on the walls of the reactor have resulted in a loss of reactor productivity (i.e., less conversion to polycrystalline silicon) and involve relatively larger reaction zones to achieve the same productivity as conventional methods.

Thus a continuing need exists for methods for producing polycrystalline silicon which limit or reduce the amount of deposits on the reactor but which result in improved productivity relative to conventional methods. A need also exists for processes which result in higher yields of polycrystalline silicon.

SUMMARY

In one aspect of the present disclosure, polycrystalline silicon is produced by the thermal decomposition of dichlorosilane in a fluidized bed reactor having a core region and a peripheral region. A first feed gas containing dichlorosilane is introduced into the core region of the fluidized bed reactor at a temperature less than about 600° C. A second feed gas is introduced into the peripheral region of the fluidized bed reactor. The fluidized bed reactor contains silicon particles and dichlorosilane thermally decomposes in the fluidized bed reactor to deposit an amount of silicon on the silicon particles. The concentration of dichlorosilane in the first feed gas exceeds the concentration in the second feed gas and the pressure in the fluidized bed reactor is at least about 3 bar.

Another aspect of the present disclosure is directed to a process for producing polycrystalline silicon by the thermal decomposition of dichlorosilane in a fluidized bed reactor. The fluidized bed reactor has a reaction chamber wall and a cross-section through which a first feed gas and a second feed gas pass. The first feed gas contains dichlorosilane and the second feed gas contains at least one compound selected from the group consisting of silicon tetrachloride, hydrogen, argon and helium. The concentration of dichlorosilane in the first feed gas exceeds the concentration in the second feed gas. The fluidized bed reactor produces at least about 100 kg/hr of polycrystalline silicon per square meter of fluidized bed reactor cross-section. The second feed gas is directed to the reaction chamber wall and the first feed gas is directed inward of the second feed gas. The temperature of the first feed gas introduced into the reactor is less than about 600° C. and the pressure in the fluidized bed reactor is at least about 3 bar. Dichlorosilane contacts silicon particles to cause silicon to deposit onto the silicon particles and increase in size.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

In accordance with embodiments of the present disclosure, it has been found that polycrystalline silicon yields in the thermal decomposition operations in a fluidized bed reactor may be improved relative to conventional processes by use of dichlorosilane as a thermally decomposable feed stock. Further it has been found that productivity of a fluidized bed reactor in which dichlorosilane is thermally decomposed to form polycrystalline silicon may be maintained or even enhanced in production processes that are adapted to reduce the deposition of silicon deposits on reactor walls and/or that reduce etching of silicon deposits.

Figure 1:
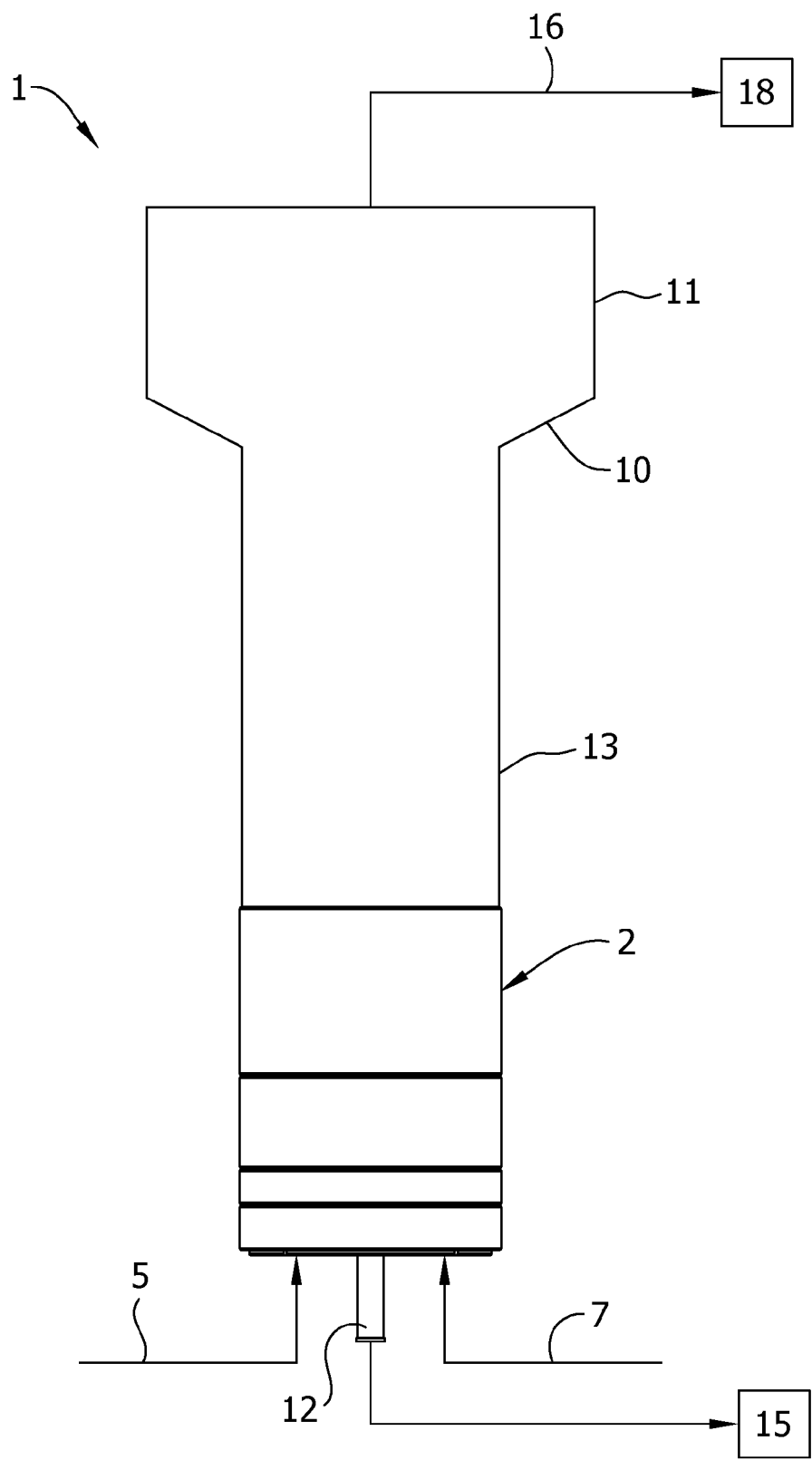
FIG. 1 is schematic of a fluidized bed reactor suitable for use in accordance with methods of the present disclosure with flows into and out of the reactor being shown.

In various embodiments of the present disclosure, formation of silicon deposits on the walls of the reactor may be reduced by introducing a first feed gas comprising dichlorosilane into the core portion of the reactor and introducing a second feed gas with a composition of dichlorosilane less than the first feed gas into a peripheral region of the fluidized bed reactor. Referring now to FIG. 1, an exemplary fluidized bed reactor 1 for carrying out the processes of the present disclosure is generally designated as 1. The reactor 1 includes a reaction chamber 10 and a gas distribution unit 2. The first feed gas 5 and a second feed gas 7 are introduced into the distribution unit 2 to distribute the respective gases into the inlet of the reaction chamber 10. In this regard, it should be understood that as used herein, "first feed gas" is a gas with a different composition than the "second feed gas" and vice versa. The first feed gas and second feed gas can compose a plurality of gaseous compounds as long as the mass composition or molar composition of at least one of the compounds in the first feed gas is different than the composition of that compound in the second feed gas. A product withdrawal tube 12 extends through the gas distribution unit 2. Product particles can be withdrawn from the tube 12 and transported to product storage 15. The reaction chamber 10 may include a lower region 13 and a freeboard region 11 which has a larger radius than the lower region 13. Gas travels upward in the reaction chamber 10 and enters the freeboard region 11. In the freeboard region 11, the gas velocity decreases causing entrained particles to fall back into the lower region 13. Spent gas 16 exits the reactor chamber 10 and can be introduced into further processing units 18. In this regard, it should be understood that the reactor 1 shown in FIG. 1 is exemplary and other reactor designs may be used without departing from the scope of the present disclosure (e.g., reactors that do not include a freeboard region).

Figure 2:
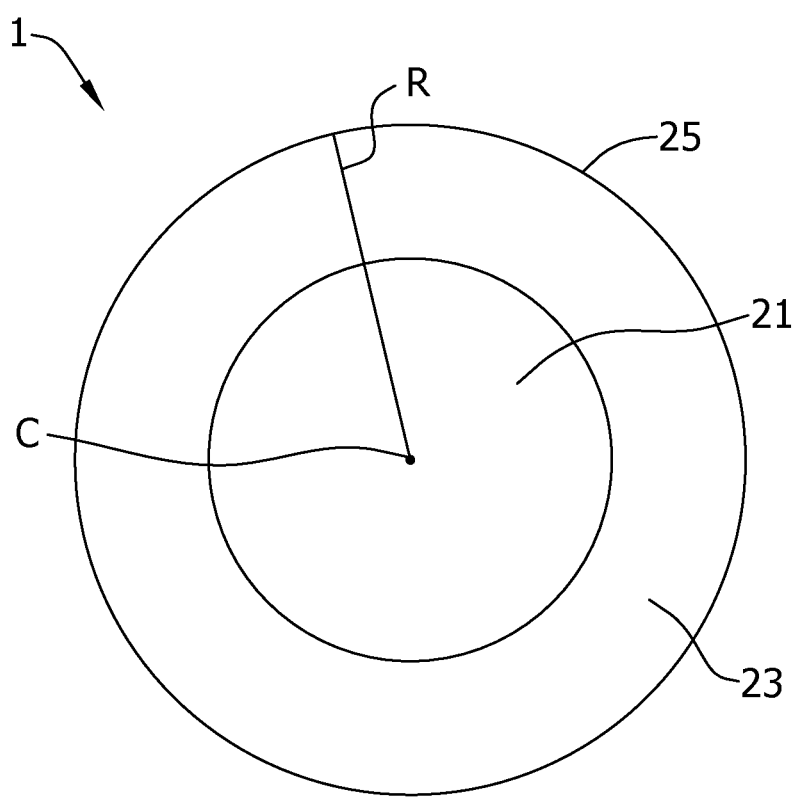
FIG. 2 is a radial cross-section view of a reaction chamber of a fluidized bed reactor according to a first embodiment with a core region and peripheral region being shown.

Referring now to FIG. 2 in which a cross-section of the fluidized bed reactor 1 is shown, the fluidized bed reactor 1 has a core region 21 that extends from the center C of the reactor to a peripheral region 23. The peripheral region 23 extends from the core region 21 to an annular wall 25. The fluidized bed reactor 1 has a radius R that extends from the center C of the reactor 1 to the annular wall 25. In various embodiments of the present disclosure, the core region extends from the center C to less than about 0.6R and, in other embodiments, to less than about 0.5R or even less than about 0.4R. In this regard, it should be understood that fluidized bed reactor designs other than as shown in FIG. 2 may be used without departing from the scope of the present disclosure. Regardless of the cross-sectional shape of the fluidized bed reactor, the ratio of the surface area of a cross-section of the core region to the surface area of a cross-section of the peripheral region may be less than about 4:3 and, in other embodiments, is less than about 1:1, less than about 1:3, less than about 1:4 or even less than about 1:5 (e.g., from about 4:3 to about 1:10 or from about 1:1 to about 1:10).

As described above, the concentration of dichlorosilane introduced into the core region 21 of the fluidized bed reactor 1 exceeds the concentration introduced into the peripheral region 23. By directing the thermally decomposable compounds (e.g., dichlorosilane) to the interior portion of the reactor and away from the reactor wall, deposition of material (e.g., such as silicon) on the reactor wall may be reduced. Generally, any method available to those of skill in the art may be used to direct a first feed gas into a core region of a fluidized bed reactor and a second feed gas into the peripheral region of the reactor may be used. For instance, a distribution unit that directs feed gases to different portions of the reactor may be used as disclosed in U.S. Patent Publication No. 2009/0324479 and U.S. Patent Publication No. 2011/0158888, which claims the benefit of U.S. Provisional Application No. 61/290,692, filed Dec. 29, 2009, both of which are incorporated herein by reference for all relevant and consistent purposes. In this regard, it should be understood that other methods and apparatus may be used to produce the desired distribution of gases without departing from the scope of the present disclosure.

In accordance with embodiments of the present disclosure, the concentration of dichlorosilane (by volume) in the first feed gas is at least about 25% greater than the concentration of dichlorosilane in the second feed gas (e.g., the first feed gas may include about 45% by volume or more of dichlorosilane and the second feed gas includes about 20% by volume or less of dichlorosilane). In various other embodiments, the concentration (by volume) of dichlorosilane in the first feed gas is at least about 35% greater than the concentration of dichlorosilane in the second feed gas or at least about 50%, at least about 75%, at least about 100%, at least about 150%, or at least about 200% greater than the concentration (by volume) of dichlorosilane in the second feed gas (e.g., from about 25% to about 200%, from about 25% to about 100% or from about 50% to about 200% greater than the concentration (by volume) of dichlorosilane in the second feed gas). In these and in other embodiments, of the total amount of dichlorosilane introduced into the fluidized bed reactor, at least about 60% of the dichlorosilane is introduced into the core region of the fluidized bed reactor (with the remaining 40% being introduced into the peripheral region). In other embodiments, at least about 75%, at least about 85% or at least about 95% of the dichlorosilane introduced into the fluidized bed reactor is introduced through the core region.

The concentration of dichlorosilane in the first feed gas may be at least about 25% by volume. In various other embodiments, the concentration may be at least about 35%, at least about 50%, at least about 65%, at least about 80%, at least about 90% or at least about 95% by volume dichlorosilane. The remainder of the first feed gas may be carrier gases such as compounds selected from the group consisting of silicon tetrachloride, hydrogen, argon and helium. In certain embodiments, the first feed gas may consist essentially of dichlorosilane (e.g., includes only minor impurities) or even consist of dichlorosilane.

Generally, the concentration of dichlorosilane in the second feed gas is less than about 50% by volume and, in other embodiments, is less than about 35%, less than about 25%, less than about 20%, less than about 15%, less than about 10%, less than about 5%, less than about 1% or from about 0.1% to about 50%, from about 0.1% to about 25%, or from about 0.1% to about 15% by volume. In this regard, it should be understood that the second feed gas may consist essentially of gases other than dichlorosilane. For instance, the second feed gas may consist essentially of one or more compounds selected from silicon tetrachloride, hydrogen, argon and helium (e.g., contains only these compounds and excludes other minor amounts of other gaseous impurities). Furthermore in this regard, the second feed gas may consist of one or more compounds selected from silicon tetrachloride, hydrogen, argon and helium.

The temperature of the first feed gas and/or second feed gas introduced into the fluidized bed reactor may be relatively low compared to conventional methods to reduce deposition of material on the reactor walls and to prevent the reaction from approaching equilibrium as further described below. For instance, the temperature of the first feed gas and/or the second feed gas (and the temperature of a theoretical gas that includes the combined first feed gas and second feed gas) may be less than about 600° C. and, in other embodiments, may be less than about 400° C. or less than about 250° C. (e.g., from about 50° C. to about 600° C., from about 100° C. to about 400° C. or from about 200° C. to about 400° C.). In some embodiments, the temperature of the first feed gas introduced into the core of the fluidized bed reactor is less than about 350° C. or even less than about 250° C. (e.g., from about 200° C. to about 350° C.) and the temperature of the second feed gas introduced into the peripheral region of the fluidized bed reactor is less than about 600° C. (e.g., from about 400° C. to about 600° C.). The first feed gas and/or second feed gas may be heated prior to introduction into the reactor and, in embodiments wherein the first and/or second feed gases include gases recycled from other process streams, the first and/or second feed gas may be cooled. Any method known to those of skill in the art for heating or cooling may be used including the use of indirect heating by steam and/or combustion gases and indirect cooling by cooling liquids (e.g., water or molten salts).

In some embodiments, it may be desirable to heat the second feed gas prior to introduction into the reactor to reduce the amount of extraneous heat that is applied to the reactor, particularly in embodiments wherein the second feed gas contains relatively low amounts of thermally decomposable compounds (e.g., dichlorosilane) or essentially no thermally decomposable compounds. For instance, the second feed gas may be heated to at least about 350° C. or at least about 450° C., at least about 550° C., at least about 650° C., at least about 750° C. or even at least about 850° C. (e.g., from about 350° C. to about 1000° C. or from about 450° C. to about 900° C.). In accordance with these embodiments, by reducing the amount of extraneous heat applied through the reactor wall, the deposition of silicon on the wall may be further reduced.

Upon entering the reaction chamber 10, dichlorosilane thermally decomposes to produce polycrystalline silicon. A number of gaseous by-products may be produced in the reactor during thermal decomposition including, for example, hydrochloric acid, silicon tetrachloride, silane and/or hydrogen. In this regard, it should be understood that reference herein to the "thermal decomposition" of dichlorosilane includes the chemical vapor deposition of dichlorosilane achieved through one or more intermediates (e.g., silane) or by direct decomposition from dichlorosilane.

As the feed gases enter the reaction chamber, they are generally heated to promote the thermal decomposition of dichlorosilane. By introducing the first feed gas or second feed gas below about 600° C. and then heating the feed gases as they travel upward in the fluidized bed reactor, the thermal decomposition reaction of dichlorosilane can be maintained below about 90% of equilibrium conversion. In this regard, maintaining a fluidized bed height that achieves a gas residence time of about 1 to 12 seconds further assists in establishing an equilibrium conversion below about 90%. Maintaining the fluidized bed reactor below about 90% equilibrium conversion is advantageous as it has been found that reactor conditions that approach equilibrium result in etching of silicon in the reactor. This etched material may be redeposited on the growing silicon particles causing contamination (e.g., chlorine contamination). By maintaining the first or second feed gas (or both gases) below about 600° C. and heating the gases as they rise through the reactor, the equilibrium conversion of the deposition reaction may be less than about 90% and, in other embodiments, less than about 80%, less than about 65%, less than about 50% or less than about 30% (e.g., from about 20% to about 90% or from about 50% to about 90%).

The degree to which equilibrium is achieved may be determined by calculating and/or modeling the amount of silicon produced in an equilibrium condition and comparing this amount to the actual amount of silicon produced in the reactor. Equilibrium for several different reactor conditions (e.g., ratio of dichlorosilane to hydrogen fed to the reactor, reactor temperature, reactor pressure, amount of carrier gas added to the reactor and the like) are shown in Table 1 below. In this regard, it should be understood that normalized flow rates per unit of time are shown in Table 1 and that the precise flow rates depend on the particular dimensions of the reactor (e.g., reactor cross-section).

TABLE 1

Equilibrium Compositions for the Thermal Decomposition of Dichlorosilane

| Reactor Feed Rates (kmol/unit time) | | | | | | | | | | | | |
|---|---|---|---|---|---|---|---|---|---|---|---|---|
| $SiH_2Cl_2$ | 1.00 | 1.00 | 1.00 | 1.00 | 1.00 | 1.00 | 1.00 | 1.00 | 1.00 | 1.00 | 1.00 | 1.00 |
| $H_2$ | 1.00 | 1.00 | 1.00 | 1.00 | 1.00 | 1.00 | 1.00 | 1.00 | 5.00 | 5.00 | 5.00 | 5.00 |
| $SiH_2Cl_2$ Mole Fraction | 50% | 50% | 50% | 50% | 50% | 50% | 50% | 50% | 17% | 17% | 17% | 17% |
| Reactor Operating Conditions | | | | | | | | | | | | |
| Temperature (° C.) | 800 | 900 | 1000 | 1050 | 800 | 900 | 1000 | 1050 | 800 | 900 | 1000 | 1050 |
| Pressure (bar) | 8 | 8 | 8 | 8 | 4 | 4 | 4 | 4 | 8 | 8 | 8 | 8 |
| Rates at Equilibrium (kmol/unit time) | | | | | | | | | | | | |
| $H_2$ | 1.845 | 1.836 | 1.822 | 1.815 | 1.861 | 1.850 | 1.833 | 1.823 | 5.786 | 5.765 | 5.734 | 5.717 |
| Si | 0.435 | 0.441 | 0.447 | 0.449 | 0.446 | 0.453 | 0.458 | 0.459 | 0.422 | 0.436 | 0.454 | 0.463 |
| $SiCl_4$ | 0.301 | 0.296 | 0.282 | 0.272 | 0.322 | 0.314 | 0.294 | 0.280 | 0.248 | 0.239 | 0.219 | 0.205 |
| $SiHCl_3$ | 0.235 | 0.225 | 0.210 | 0.201 | 0.035 | 0.068 | 0.118 | 0.147 | 0.283 | 0.266 | 0.241 | 0.227 |
| HCl | 0.029 | 0.056 | 0.098 | 0.122 | 0.209 | 0.198 | 0.182 | 0.173 | 0.063 | 0.119 | 0.207 | 0.257 |
| $SiCl_2$ | 0.001 | 0.004 | 0.013 | 0.022 | 0.001 | 0.006 | 0.020 | 0.032 | 0.001 | 0.006 | 0.019 | 0.031 |
| $SiCl_3$ | 0.004 | 0.011 | 0.024 | 0.033 | 0.005 | 0.013 | 0.030 | 0.040 | 0.005 | 0.012 | 0.025 | 0.034 |
| $SiH_2Cl_2$ | 0.022 | 0.023 | 0.023 | 0.022 | 0.016 | 0.017 | 0.016 | 0.016 | 0.039 | 0.040 | 0.039 | 0.038 |
| Conversion | 98% | 98% | 98% | 98% | 98% | 98% | 98% | 98% | 96% | 96% | 96% | 96% |
| Selectivity | 44% | 44% | 45% | 45% | 45% | 45% | 46% | 46% | 42% | 44% | 45% | 46% |

Once the equilibrium conditions are determined, the amount of silicon produced in the reactor may be determined and compared to the equilibrium amount. The degree of equilibrium may be controlled by using relatively low temperature feed gases as described above and/or by controlling the gas residence time in the reaction chamber of the fluidized bed reactor. As used herein, the gas residence time refers to the average time the following gases are within the reactor: the carrier gas (e.g., silicon tetrachloride, hydrogen, argon and/or helium), the hydrogen and chlorine atoms of dichlorosilane which react to form hydrogen chloride and/or hydrogen upon deposition of silicon, and unreacted dichlorosilane. In some embodiments of the present disclosure, the average residence time of these gases may be less than about 12 seconds and, in other embodiments, less than about 9 seconds or less than about 4 seconds (e.g., from about 1 second to about 12 seconds). Residence time may be controlled by varying one or more of, for example, the reaction chamber height, the gas flow rate and the size of the particulate silicon within the bed.

It has been found that to maintain acceptable productivity when using the methods described above for reducing the deposition of material on the reactor walls or to even enhance productivity relative to conventional methods for production, one or more of the following methods may be used: (1) the pressure of the fluidized bed reactor may be controlled to be within a specified range as described below, (2) the first and second fluidized gases may be heated rapidly to promote deposition of polycrystalline silicon while maintaining the reactor below about 90% equilibrium conversion, (3) the overall concentration of dichlorosilane in gases introduced into the reactor may be at least about 10% by volume, and/or (4) the diameter of the withdrawn polycrystalline particulate may be controlled to be within a specified range as described below. Further it has been found that use of dichlorosilane may improve productivity relative to other reactor systems (e.g., trichlorosilane) due to increased yields in dichlorosilane fluidized bed reactor systems.

In certain embodiments of the present disclosure, the absolute pressure in the fluidized bed reactor may be at least about 3 bar. It has been found that by maintaining the pressure of the fluidized bed reactor above about 3 bar, sufficient reactor productivity may be achieved. In these and in other embodiments, the reactor pressure may be controlled to be less than about 8 bar as pressure above about 8 bar may involve relatively high application of extraneous heat (e.g., higher temperatures) through the reactor walls and may result in an unacceptable amount of silicon deposition on the reactor walls. In certain embodiments, the pressure of the reactor is controlled to be at least about 4 bar, at least about 5 bar, at least about 6 bar, at least about 7 bar, from about 3 bar to about 8 bar or from about 4 bar to about 8 bar.

In this regard, it should be understood that the pressure of the reactor typically decreases as gas passes upward through the reactor. To account for this variation, the pressure of the reactor may be measured near the gas discharge to ensure that the minimum pressures (e.g., about 3 bar) are achieved. In certain embodiments of the present disclosure, the pressure of the spent gas discharged from the reactor is measured to ensure that the fluidized bed is operated within the recited pressure ranges. For instance, the pressure of the spent gas may be at least about 3 bar, at least about 5 bar, at least about 6 bar, at least about 7 bar or from about 3 bar to about 8 bar.

Figure 3:
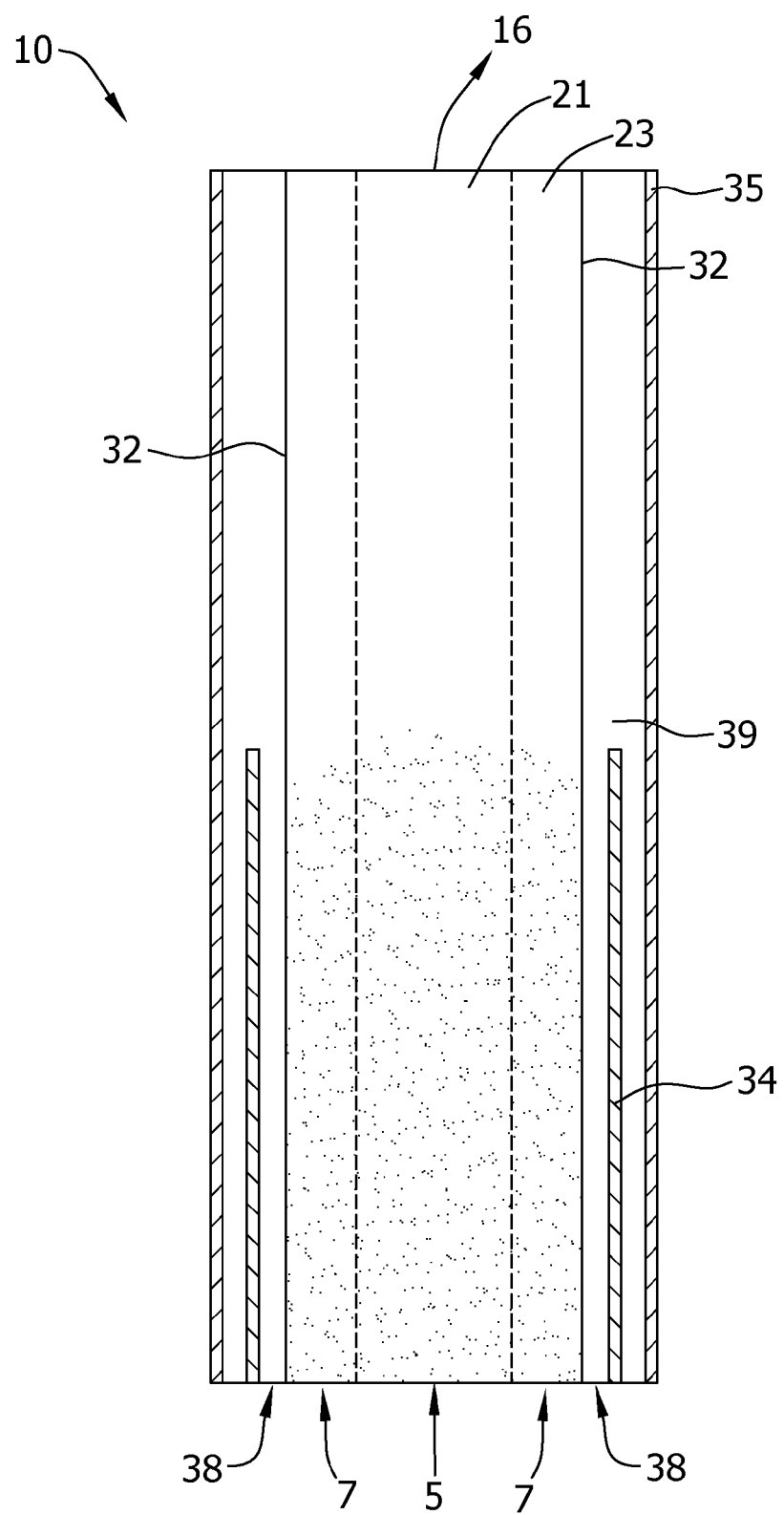
FIG. 3 is an axial cross-section view of a reaction chamber of a fluidized bed reactor according to a second embodiment with a reaction liner and reactor shell being shown.

As described above, the temperature of the first feed gas and/or second feed gas introduced into the fluidized bed reactor may be less than about 600° C. It has been found that by rapidly heating the incoming gases (but yet maintaining the equilibrium conversion of the deposition reaction below about 90% as described above) the productivity of the fluidized bed reactor may be increased. Referring now to FIG. 3 in which the reaction chamber 10 of the fluidized bed reactor is shown according to one or more embodiments of the present disclosure, to achieve such relatively rapid heating and to avoid use of high temperature gradients which may degrade the reactor materials, the heating apparatus 34 of the fluidized bed reactor may be maintained within an annular inner chamber 39 formed between a reaction liner 32 and an outer shell 35 of the reactor. By positioning the heating apparatus 34 inward of the outer shell 35, the heating apparatus may be operated at lower temperatures as heat is not directed through both the outer shell 35 and the liner 32 to reach the contents of the reaction chamber. In various embodiments, a gas 38 (e.g., argon, hydrogen, nitrogen and/or helium) may be included within the inner chamber 39 and is preferably continuously introduced into and withdrawn from the inner chamber. This gas 38 acts to protect the heating apparatus 34 from corrosion caused by exposure to process gases that leak through the reaction liner 32 into the inner chamber 39. The gas 38 may be maintained at a pressure above the pressure of the process gases 5, 7 (e.g., a pressure within the range of about 0.005 bar to about 0.2 bar) such that if the liner 32 develops an opening (e.g., crack or pin-holes), the insulating gas 38 passes through the liner 32 rather than process gas entering the inner chamber 39. The gas 38 may also be maintained at a temperature below the process gasses 5, 7 to prevent corrosion. Further, gas 38 may be monitored as it is withdrawn from the inner chamber 39 to detect the presence of process gas (e.g., dichlorosilane, hydrogen chloride or hydrogen) which would indicate that that the liner 32 had developed an opening (e.g., crack or pin-holes) and that repairs may be needed. The inner chamber 39 (or a portion thereof) may include insulating material to prevent heat from being lost through the shell 35. The insulating material used may be any material suitable for insulating at high temperatures (both carbon and inorganic materials) as appreciated by those of skill in the art and may take a variety of forms including insulating blocks, blankets or felts.

Exemplary fluidized bed reactors for use in accordance with the present disclosure include those disclosed in U.S. Patent Publication No. 2008/0299291, U.S. Patent Publication No. 2008/0241046 and U.S. Patent Publication No. 2009/0095710, each of which is incorporated herein by reference for all relevant and consistent purposes. In this regard, it should be understood that reactor designs other than as shown in FIG. 3 and other than as described in the recited publications may be used without departing from the scope of the present disclosure.

The heating apparatus 34 may be an electrical resistance heater or one or more induction coils; however, other types of heating apparatus may be used without limitation (e.g., the heating apparatus 34 may be heated gas such as a combustion gas). The liner 32 may be made of any material suitable for fluidized bed reactor operations and for production of granular polycrystalline silicon and, particularly, material that is sufficiently resistant to etching and degradation which may result in contamination of polycrystalline silicon product. Suitable materials include, for example, quartz, graphite coated with silicon or coated with silicon carbide, and silicon carbide coated with silicon. The outer shell 35 may be made of any number of metallic materials (e.g., metal alloys including carbon steel or stainless steel).

Upon entry into the fluidized bed reactor, the first feed gas and the second feed gas are heated and continue to heat as they rise in the reaction chamber. The reaction gases may be heated to at least about 700° C. prior to being discharged from the fluidized bed reactor (or prior to being quenched as described below) and, in other embodiments, to at least about 900° C., to at least about 1000° C. or to at least about 1100° C. (e.g., from about 700° C. to about 1200° C., from about 700° C. to about 1100° C. or from about 900° C. to about 1100° C.).

To increase productivity of the fluidized bed reactor, the concentration of dichlorosilane introduced into the reactor may be controlled to be relatively high compared to conventional methods. Generally, the overall concentration of dichlorosilane introduced into the fluidized bed reactor (i.e., the amount in the first feed gas and the second feed gas combined) should be sufficiently high to not sacrifice substantial reactor productivity but sufficiently low to not cause substantial formation of silicon dust. In various embodiments, the overall concentration may be at least about 10% by volume or at least about 20%, at least about 30%, at least about 40% or at least about 50% by volume (e.g., from about 10% to about 80%, from about 10% to about 50% or from about 30% to about 60%).

As shown in FIG. 1, particulate polycrystalline silicon is withdrawn from the product withdrawal tube 12. Particulate polycrystalline silicon may be withdrawn from the reactor intermittently as in batch operations; however, it is preferred that the particulate product be withdrawn continuously. Regardless of whether batch or continuous withdrawal of silicon product is used, it has been found that the size of the product particles when withdrawn from the reactor influences the reactor productivity. For instance, it has been found that generally increasing the size of the withdrawn silicon particulate results in increased reactor productivity; however if the product particles are allowed to grow too large, contact between the gas and solid phases in the reactor may be reduced thereby reducing productivity. Accordingly, in various embodiments of the present disclosure, the mean diameter of the particulate polycrystalline silicon that is withdrawn from the reactor is from about 600 μm to about 1200 μm, from about 800 μm to about 1200 μm or from about 900 μm to about 1100 μm. In this regard, it should be understood that references herein to the "mean diameter" of various particles refers to the Sauter mean diameter unless stated otherwise. The Sauter mean diameter may be determined according to methods generally known by those of skill in the art.

Use of one or more of the methods described above may allow for relatively high reactor productivity to be maintained even in embodiments wherein one or more of the methods for reducing the deposition of material on the reactor walls as also described above are employed. As appreciated by those of skill in the art, the reactor productivity may be expressed as a rate of polycrystalline silicon production per reactor cross-section area. In accordance with the present disclosure, when one or more of the above-referenced methods for increasing the reactor productivity are used, at least about 100 kg/hr of silicon deposits on the silicon particles within the reactor per square meter of fluidized bed reactor cross-section. In other embodiments, at least about 125 kg/hr of silicon deposits on the silicon particles within the reactor per square meter of fluidized bed reactor cross-section or at least about 175 kg/hr, at least about 250 kg/hr, at least about 325 kg/hr or from about 100 kg/hr to about 350 kg/hr, from about 125 kg/hr to about 300 kg/hr or from about 175 kg/hr to about 300 kg/hr of silicon deposits on the silicon particles per square meter of fluidized bed reactor cross-section. In this regard, it should be understood that in embodiments wherein the cross-section of the fluidized bed reactor varies along the length of the reactor, the recited cross-sectional area refers to a cross-section that is averaged over the length of the reactor (e.g., the length of the reactor in which at least about 90% of the deposition occurs). It should be further understood that the reactor may have localized regions in which the productivity is higher or lower than the recited values without departing from the scope of the present disclosure.

Silicon seed particles are added to the reactor to provide a surface to which polycrystalline silicon may deposit. The seed particles continuously grow in size until they exit the reactor as particulate polycrystalline silicon product. The seed particles may be added to the reactor batchwise or continuously. The average diameter (i.e., Sauter mean diameter) of the crystal seed particles may be from about 50 μm to about 800 μm and, in some embodiments, is from about 200 μm to about 500 μm. The source of silicon seed particles include product particles collected from the reactor that are ground to the desired size and/or small polycrystalline particles gathered with and separated from the granular polycrystalline product.

During operation of the fluidized bed reactor system, the fluidizing gas velocity through the reaction zone of the fluidized bed reactor is maintained above the minimum fluidization velocity of the polycrystalline particles. The gas velocity through the fluidized bed reactor is generally maintained at a velocity of from about 1 to about 8 times the minimum fluidization velocity necessary to fluidize the particles within the fluidized bed. In some embodiments, the gas velocity is from about 2 to about 5 times the minimum fluidization velocity necessary to fluidize the particles within the fluidized bed. The minimum fluidization velocity varies depending on the properties of the gas and particles involved. The minimum fluidization velocity may be determined by conventional means (see p. 17-4 of Perry's Chemical Engineers' Handbook, 7th. Ed., incorporated herein by reference for all relevant and consistent purposes). Although the present disclosure is not limited to specific minimum fluidization velocities, minimum fluidization velocities useful in the present disclosure range from about 0.7 cm/sec to about 250 cm/sec or even from about 6 cm/sec to about 100 cm/sec.

Gas velocities higher than the minimum fluidization flow rate are often desired to achieve higher productivities. As the gas velocity increases beyond the minimum fluidization velocity, the excess gas forms bubbles, increasing the bed voidage. The bed can be viewed to be composed of bubbles and "emulsion" containing gas in contact with silicon particles. The quality of the emulsion is quite similar to the quality of the bed at the minimum fluidization condition. The local voidage in the emulsion is close to the minimum fluidization bed voidage. Hence, bubbles are generated by the gas introduced in excess of what is required to achieve the minimum fluidization. As the ratio of actual gas velocity to the minimum fluidization velocity increases, the bubble formation intensifies. At a very high ratio, large slugs of gas are formed in the bed. As the bed voidage increases with the total gas flow rate, the contact between solids and gases becomes less effective. For a given volume of the bed, the surface area of solids in contact with reacting gases decreases with increasing bed voidage resulting in reduced conversion to the polycrystalline silicon product. Accordingly, the gas velocity should be controlled to maintain decomposition within acceptable levels.

In some embodiments of the present disclosure and as shown in FIG. 1, the reaction chamber 10 of the fluidized bed reactor 1 includes a "freeboard" region 11 in which the diameter of the reaction chamber is increased to reduce the velocity of the fluidization gas and allow particulate material to separate from the gas. In this regard, it should be understood that in embodiments in which the reactor does include a freeboard region, this region is considered to be part of the reaction chamber unless stated otherwise (e.g., for determination of the mean radius of the reactor, residence time and the like). A quench gas may be introduced into the freeboard region of the reactor (e.g., silicon tetrachloride, hydrogen, argon and/or helium) to reduce the formation of silicon dust by decreasing the temperature of the gas prior to discharge from the reactor. Suitable methods for using such a quench gas are described in U.S. Pat. No. 4,868,013, which is incorporated herein by reference for all relevant and consistent purposes. The temperature and flow rate of the quench gas should be selected to cause the temperature of the discharged spent gas to be less than about 800° C. and, in other embodiments, less than about 700° C., less than about 600° C., from about 500° C. to about 800° C. or from about 500° C. to about 700° C. The temperature of the quench gas may be less than about 500° C., less than about 400° C., less than about 300° C., less than about 200° C., less than about 100° C. or even less than about 50° C. (e.g., from about 10° C. to about 500° C., from about 10° C. to about 300° C. or from about 100° C. to about 500° C.). The weight ratio of gases introduced to the reactor to quench gas may be from about 20:1 to about 700:1 or from about 50:1 to about 300:1.

In some embodiments of the present disclosure, the conversion of dichlorosilane in the fluidized bed reactor may be at least about 30%, at least about 45%, at least about 60% or at least about 85% (e.g., from about 30% to about 98% or from about 60% to about 98%). The selectivity toward deposited silicon may be at least about 20%, at least about 25%, at least about 30% or even at least about 40% (e.g., from about 20% to about 50% or from about 25% to about 35%). The yield of polycrystalline silicon may be at least about 10%, at least about 20%, at least about 30% or even at least about 45% (e.g., from about 10% to about 45% or from about 20% to about 42%).

When introducing elements of the present disclosure or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above apparatus and methods without departing from the scope of the disclosure, it is intended that all matter contained in the above description and shown in the accompanying figures shall be interpreted as illustrative and not in a limiting sense.

What is claimed is:

1. A process for producing polycrystalline silicon by the thermal decomposition of dichlorosilane in a fluidized bed reactor having a core region and a peripheral region, the process comprising:
    introducing a first feed gas comprising dichlorosilane into the core region of the fluidized bed reactor, the fluidized bed reactor containing silicon particles and the temperature of the first feed gas being less than about 600° C., the dichlorosilane thermally decomposing in the fluidized bed reactor to deposit an amount of silicon on the silicon particles; and
    introducing a second feed gas into the peripheral region of the fluidized bed reactor, wherein the concentration of dichlorosilane in the first feed gas exceeds the concentration in the second feed gas and the pressure in the fluidized bed reactor is at least about 3 bar, the fluidized bed reactor operating at a conversion of less than about 80% of a conversion at equilibrium.

2. The process as set forth in claim 1 wherein the fluidized bed reactor comprises an annular wall and has a circular cross-section having a center and a radius R, wherein the core region extends from the center to less than about 0.6R and the peripheral region extends from the core region to the annular wall.

3. The process as set forth in claim 1 wherein the fluidized bed reactor operates at less than about 70% equilibrium conversion.

4. The process as set forth in claim 1 wherein the temperature of the first feed gas is less than about 400° C.

5. The process as set forth in claim 1 wherein the temperature of the second feed gas is less than about 600° C.

6. The process as set forth in claim 1 wherein the pressure in the fluidized bed reactor is from about 3 bar to about 8 bar.

7. The process as set forth in claim 1 wherein the concentration (by volume) of dichlorosilane in the first feed gas is at least about 25% greater than the concentration of dichlorosilane in the second feed gas.

8. The process as set forth in claim 1 wherein at least about 60% of the dichlorosilane introduced into the fluidized bed reactor is introduced through the core region.

9. The process as set forth in claim 1 wherein polycrystalline silicon is withdrawn from the fluidized bed reactor, the Sauter mean diameter of the particulate polycrystalline silicon being from about 600 µm to about 1200 µm.

10. The process as set forth in claim 1 wherein the average residence time of the first and second feed gases introduced into the fluidized bed reactor is less than about 12 seconds.

11. The process as set forth in claim 1 wherein the fluidized bed reactor has a cross-section through which the first feed gas and second feed gas pass as dichlorosilane thermally decomposes to deposit an amount of silicon on the silicon particles, wherein at least about 100 kg/hr of silicon deposits on the silicon particles per square meter of fluidized bed reactor cross-section.

12. The process as set forth in claim 1 wherein the silicon particles are continuously withdrawn from the fluidized bed reactor.

13. The process as set forth in claim 1 wherein the second feed gas comprises less than about 50% by volume dichlorosilane.

14. The process as set forth in claim 1 wherein the second feed gas consists essentially of compounds other than dichlorosilane.

15. The process as set forth in claim 1 wherein the second feed gas consists essentially of one or more compounds selected from the group consisting of silicon tetrachloride, hydrogen, argon and helium.

16. The process as set forth in claim 1 wherein the first feed gas comprises at least about 25% by volume dichlorosilane.

17. The process as set forth in claim 1 wherein the overall concentration of dichlorosilane in the first feed gas and the second feed gas is at least about 10% by volume.

18. The process as set forth in claim 1 wherein the conversion of dichlorosilane in the fluidized bed reactor is at least about 30%.

19. The process as set forth in claim 1 wherein the selectivity toward deposited silicon is at least about 20%.

20. The process as set forth in claim 1 wherein the fluidized bed reactor operates at less than about 50% equilibrium conversion.

21. The process as set forth in claim 1 wherein the temperature of the first feed gas is from about 100° C to about 400° C.

22. The process as set forth in claim 1 wherein the temperature of the second feed gas is from about 100° C to about 400° C.

23. The process as set forth in claim 1 wherein the concentration (by volume) of dichlorosilane in the first feed gas is from about 50% to about 200% greater than the concentration (by volume) of dichlorosilane in the second feed gas.

24. The process as set forth in claim 1 wherein at least about 85% of the dichlorosilane introduced into the fluidized bed reactor is introduced through the core region.

25. The process as set forth in claim 1 wherein the average residence time of the first and second feed gases introduced into the fluidized bed reactor is less than about 9 seconds.

26. The process as set forth in claim 1 wherein the fluidized bed reactor has a cross-section through which the first feed gas and second feed gas pass as dichlorosilane thermally decomposes to deposit an amount of silicon on the silicon particles, wherein at least about 250 kg/hr of silicon deposits on the silicon particles per square meter of fluidized bed reactor cross-section.

27. The process as set forth in claim 1 wherein the second feed gas comprises less than about 15% by volume dichlorosilane.

28. The process as set forth in claim 1 wherein the first feed gas comprises at least about 65% by volume dichlorosilane.

29. The process as set forth in claim 1 wherein the overall concentration of dichlorosilane in the first feed gas and the second feed gas is from about 10% to about 80%.

30. The process as set forth in claim 1 wherein the conversion of dichlorosilane in the fluidized bed reactor is at least about 45%.

31. The process as set forth in claim 1 wherein the selectivity toward deposited silicon is from about 20% to about 50%.

32. A process for producing polycrystalline silicon by the thermal decomposition of dichlorosilane in a fluidized bed reactor, the fluidized bed reactor having a reaction chamber wall and a cross-section through which a first feed gas and a second feed gas pass, the first feed gas comprising dichlorosilane and the second feed gas comprising at least one compound selected from the group consisting of silicon tetrachloride, hydrogen, argon and helium, the concentration of dichlorosilane in the first feed gas exceeding the concentration in the second feed gas, the fluidized bed reactor producing at least about 100 kg/hr of polycrystalline silicon per square meter of fluidized bed reactor cross-section, the process comprising:
   directing the second feed gas to the reaction chamber wall and directing the first feed gas inward of the second feed gas, the temperature of the first feed gas being less than about 600° C and the pressure in the fluidized bed reactor being at least about 3 bar, wherein dichlorosilane contacts silicon particles to cause silicon to deposit onto the silicon particles and increase in size, the fluidized bed reactor operating at a conversion of less than about 80% of a conversion at equilibrium.

33. The process as set forth in claim 32 wherein the fluidized bed reactor operates at less than about 60% equilibrium conversion.

34. The process as set forth in claim 32 wherein the temperature of the first feed gas and the temperature of the second feed gas are less than about 400° C.

35. The process as set forth in claim 32 wherein the pressure in the fluidized bed reactor is from about 3 bar to about 8 bar.

36. The process as set forth in claim 32 wherein the concentration (by volume) of dichlorosilane in the first feed gas is at least about 150% greater than the concentration (by volume) of dichlorosilane in the second feed gas.

37. The process as set forth in claim 32 wherein the average residence time of gas introduced into the fluidized bed reactor is from about 1 second to about 12seconds.

38. The process as set forth in claim 32 wherein at least about 175 kg/hr of silicon deposits on the silicon particles per square meter of fluidized bed reactor cross-section.

39. The process as set forth in claim 32 wherein the second feed gas comprises less than about 1% by volume dichlorosilane.

40. The process as set forth in claim 32 wherein the second feed gas consists essentially of compounds other than dichlorosilane.

41. The process as set forth in claim 32 wherein the second feed gas consists essentially of one or more compounds selected from the group consisting of silicon tetrachloride, hydrogen, argon and helium.

42. The process as set forth in claim 32 wherein the first feed gas comprises at least about 95% by volume dichlorosilane.

43. The process as set forth in claim 32 wherein the overall concentration of dichlorosilane in the first feed gas and the second feed gas is at least about 50% by volume.

44. The process as set forth in claim 32 wherein the conversion of dichlorosilane in the fluidized bed reactor is from about 60% to about 98%.

45. The process as set forth in claim 32 wherein the selectivity toward deposited silicon is at least about 40%.

* * * * *